United States Patent
Cabral, Jr. et al.

(10) Patent No.: US 6,291,885 B1
(45) Date of Patent: *Sep. 18, 2001

(54) THIN METAL BARRIER FOR ELECTRICAL INTERCONNECTIONS

(75) Inventors: Cyril Cabral, Jr., Ossining; Patrick William DeHaven, Poughkeepsie; Daniel Charles Edelstein, New Rochelle; David Peter Klaus, Yorktown Heights, all of NY (US); James Manley Pollard, III, Bethel, CT (US); Carol L. Stanis, Portland, ME (US); Cyprian Emeka Uzoh, Hopewell Junction, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/896,925

(22) Filed: Jul. 18, 1997

Related U.S. Application Data

(63) Continuation of application No. 08/497,065, filed on Jun. 30, 1995, now abandoned.

(51) Int. Cl.[7] ..................................................... H01L 23/48
(52) U.S. Cl. ......................... 257/751; 257/761; 257/762; 257/768
(58) Field of Search .................................... 257/753, 768, 257/751, 762, 761

(56) References Cited

U.S. PATENT DOCUMENTS

| | | | |
|---|---|---|---|
| 4,385,116 | 5/1983 | Nair et al. | 427/99 |
| 4,789,648 | 12/1988 | Chow et al. | 437/225 |
| 4,944,836 | 7/1990 | Beyer et al. | 156/645 |
| 5,221,449 | 6/1993 | Colgan et al. | 204/192.15 |
| 5,281,485 | * 1/1994 | Colgan et al. | 428/457 |
| 5,316,974 | * 5/1994 | Crank | 257/751 |

FOREIGN PATENT DOCUMENTS

| | | | |
|---|---|---|---|
| 0 024 863 A3 | 3/1981 | (EP) | H01L/27/01 |
| 0 568 108 A1 | 3/1993 | (EP) | H01L/21/3205 |
| WO 92/07968 | 5/1992 | (WO) | C23C/14/14 |

OTHER PUBLICATIONS

*CRC Handbook of Chem. and Physics*, Ed., 1973, D52.*
B. Luther et al, "Planar copper–Polyimide Back End of Line Inter–connections for ULSI Devices" VMIC Conf. Jun. 1993 ISMIC pp.15–21.

(List continued on next page.)

*Primary Examiner*—T. N. Quach
(74) *Attorney, Agent, or Firm*—Connolly Bove Lodge & Hutz; Robert M. Trepp

(57) ABSTRACT

An interconnect structure and barrier layer for electrical interconnections is described incorporating a layer of TaN in the hexagonal phase between a first material such as Cu and a second material such as Al, W, and PbSn. A multilayer of TaN in the hexagonal phase and Ta in the alpha phase is also described as a barrier layer. The invention overcomes the problem of Cu diffusion into materials desired to be isolated during temperature anneal at 500° C.

24 Claims, 9 Drawing Sheets

OTHER PUBLICATIONS

Binary Alloy Phase Diagrams, vol. 3, Massalski et al., ASM International, 1990, pp. 2703–2704.

Katsutaka Sasaki et al., "Stoichiometry of Ta–N Film and Its Application for Diffusion Barrier in the $Al_3Ta/Ta$–N/Si Contact System", Japanese Journal of Applied Physics, vol. 29, No. 6, Jun. 1990, pp. 1043–1047.

J. K. Howard et al., "Improved Process for Gold Metallization", IBM Technical Disclosure Bulletin, vol. 23, No. 7B, Dec. 1980, pp. 3227–3228.

R. Petrovic et al., "Electrical and Structural Properties of Tantalum Nitride Thin Films Deposited by Sputtering", Thin Solid Films, vol. 57, (1979), pp. 333–336.

S–Q Wang, "Barriers Against Copper Diffusion into Silicon and Drift Through Silicon Dioxide", MRS Bulletin 19, 30, (1994).

C.–K. Hu et al., "Diffusion Barrier Studies for Cu", Proc. VLSI Multilevel Interconn. Conf. 181, (1986).

L.A. Clevenger et al., "Comparison of High Vacuum and Ultra–High–Vacuum Tantalum Diffusion Barrier Performance Against Copper Penetration", J. Appl. Phys. 73,300 (1993).

K. Holloway et al., "Tantalum as a Diffusion Barrier Between Copper and Silicon: Failure Mechanism and Effect of Nitrogen Additions", J. Appl. Phys. 71, 5433 (1992).

R.H. Lacombe et al., "Comparison of Finite Element Stress Analysis Results with Peel Strength at the Copper–Polyimide Interface", J. Adhesion Sci. Technol. 7, 1293 (1993).

E. G. Colgan et al., "Method of Eliminating Ta Hydride Formation During Cu Plating on Ta Films", IBM Tech. Discl. Bulletin, 34, No. 7A, Dec. 1991, p. 284.

K. Holloway et al., "Tantalum as a Diffusion Barrier Between Copper and Silicon" Appl. Phys. Lett. 57, 1736 (1990).

* cited by examiner

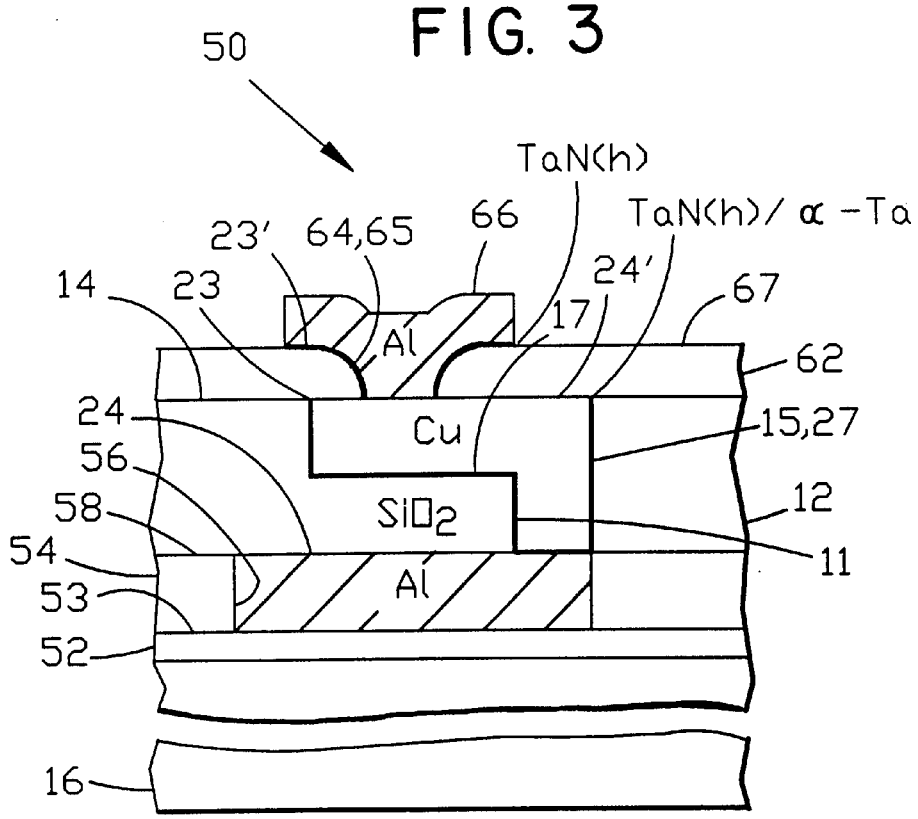
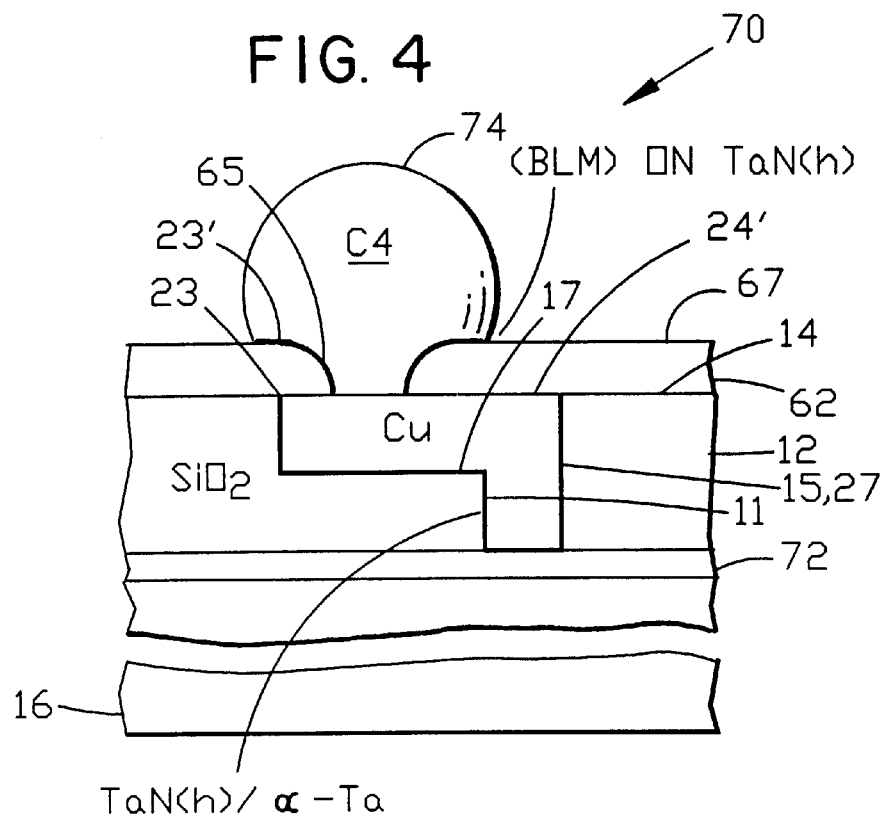

THIN METAL BARRIER FOR ELECTRICAL INTERCONNECTIONS

This is a continuation, of application Ser. No. 08/497,065 filed Jun. 30, 1995, abandoned.

FIELD OF THE INVENTION

This invention relates to metal interconnects and more particularly to a metal diffusion barrier and liner for VLSI and ULSI metal interconnects, studs, for CMOS gate stacks on semiconductor chips, and for electrical interconnections in packaging and display devices.

BACKGROUND OF THE INVENTION

On VLSI and ULSI semiconductor chips, Al and alloys of Al are used for conventional chip wiring material. The incorporation of Cu and alloys of Cu as a chip wiring material results in improved chip performance and superior reliability when compared to Al and alloys of Al. However, Cu must be successfully isolated from the devices formed in the silicon substrate below and from the surrounding back end of the line (BEOL) insulators. To accomplish this isolation i.e. to prevent diffusion of Cu, a thin liner material is deposited on the patterned BEOL insulator, e.g. trenches formed in the Damascene process, or unpatterned insulator e.g. Cu reactive ion etching (RIE) or through mask Cu deposition process before the Cu is deposited. The thin film liner must also serve as adhesion layer to adhere the copper to the surrounding dielectric. Adhesion of copper directly to most insulators is generally poor.

TiN has been evaluated as a Cu barrier and has been reported in the literature as a barrier for Cu interconnects in $SiO_2$. In a publication by S-Q Wang, MRS Bulletin 19, 30, (1994) entitled "Barriers against copper diffusion into silicon and drift through silicon dioxide", various barrier systems including TiN are shown for placement between $Si/SiO_2$ and Cu. TiN has good adhesion to $SiO_2$. However, Cu adheres poorly to TiN. A very thin glue or adhesion layer of Ti may be used to enhance the adhesion of Cu to TiN; however, this Ti layer drastically degrades the conductivity of the copper film during subsequent thermal processing. In addition, TiN has been known to form a corrosion couple with copper in certain copper polishing slurries used in chemical mechanical polishing (CMP).

Unlike TiN, pure or oxygen-doped Ta adheres poorly to some insulators such as $SiO_2$. It also forms the high-resistivity beta-phase Ta when deposited directly on the insulator. Furthermore, the Cu barrier properties of Ta fail when it is in contact with Al at moderate temperatures. See for example, the publication by C. -K Hu et al., Proc. VLSI Multilevel Interconn. Conf. 181, (1986) which described an investigation of diffusion barriers to Cu wherein tantalum, silicon nitride and titanium nitride were found to be the good diffusion barriers to Cu. It is reported that oxygen in the Ta films may have inhibited Cu diffusion.

In a publication by L. A. Clevenger et al., J. Appl. Phys. 73, 300 (1993), the effects of deposition pressure, in situ oxygen dosing at the Cu/Ta interface, hydrogen and oxygen contamination and microstructure on diffusion barrier failure temperatures for HV and UHV electron-beam deposited Ta thin films penetrated by Cu were investigated.

$Ta_2N$ has been proposed as a good copper diffusion barrier, but its adhesion to BEOL insulators and copper is relatively poor. In contrast, the adhesion of TaN ($N^{18}$ 50%) is adequate, while the adhesion of Cu to TaN is poor. A thin Ta layer can be used to enhance the adhesion of Cu to TaN, without the Ta degrading the performance of Cu BEOL. Such a dual-component liner has been previously disclosed in U.S. Pat. No. 5,281,485 Jan. 25, 1994 to E. G. Colgan and P. M. Fryer. However, the resistivity of this Ta(N) is at least 1200 Micro Ohm-cm, which leads to larger vias or stud resistances, and the inability of the metal liner to act as a redundant current strap or path.

For deep-submicron vias (e.g. less than 0.5 um wide) with ~250 Å liner at the bottom, the series resistance of the above Ta-based liners is in the range from 1 to 5 Ohms. By contrast, the copper stud resistance would be less than 10% of the Ta based liner. Although these via resistances compare very favorably with those of Al(Cu)/W-stud values, it is desirable to reduce them below the 1 Ohm range.

SUMMARY OF THE INVENTION

In accordance with the present invention, a barrier layer is provided comprising a layer of TaN in the hexagonal phase positioned between a first material to be confined and a second material whereby the second material is isolated from said first material. The first material may be one or a combination of Cu, Al, W and PbSn.

The invention further provides a layer of TaN in the hexagonal phase which may be positioned between the gas $WF_6$ and a second material to be isolated from the first material.

The invention further provides an interconnect structure comprising a first insulation layer having an upper and lower surface and having a plurality of grooves formed in the upper surface, some of the grooves having regions extending to the lower surface to expose respective conducting surfaces in a second interconnect structure below the first insulation layer, a liner including a layer of TaN in the hexagonal phase formed on the sidewalls and bottom of the plurality of grooves and on the exposed respective conducting surfaces, and a metal formed in the plurality of grooves to substantially fill the plurality of grooves.

The invention further provides a liner or barrier layer for VLSI/ULSI interconnects and C4 solder bumps made mostly of Pb—Sn which simultaneously achieves good diffusion barrier performance, good adhesion to BEOL insulators, good adhesion of interconnect metal to this liner, low resistivity, and good conformality in trenches and vias. The interconnects and studs may comprise aluminum, copper, tungsten, or C4 solder balls made of lead-tin alloy.

The invention provides a liner composed of predominately highly oriented and non-highly oriented (random) hexagonal phase TaN (30–60% nitrogen) (which may contain up to 50% cubic phase TaN) deposited alone or as a thin film laminate in combination with other suitable metal films such as Ta. Preferably, the TaN is 100% hexagonal phase.

The liner material described above provides a high integrity barrier, low stress, low resistivity and excellent adhesion to both metal and various dielectrics, such as polymers, silicon dioxide, BPSG, and diamond-like carbon and isolates lead-tin solder metallurgy from Cu and Al interconnects.

The invention further provides a thin film material for isolating Al wiring levels from an immediate Cu interconnection level above or below.

The invention further provides a liner which isolates a metal layer of W, Cu, alloys of Cu, Al and alloys of Al from the contact silicide ($WSi_2$, $CoSi_2$, $TiSi_2$, $TaSi_2$ and PtSi) and polycrystalline silicon in a MOSFET (metal oxide semiconductor field effect transistor) gate stack.

The invention further provides a liner to shield existing metal from certain gases such as $WF_6$, which is corrosive and used as a precursor gas for the deposition of W.

The invention further provides a liner which provides good contact resistance to preceding levels of metal, such as aluminum in BEOL wiring.

The invention further provides a liner which provides markedly better conformality than Ti-based compounds even without collimation sputtering or chemical vapor deposition (CVD).

The invention further provides a thin film to isolate BEOL interconnect metals from alloying or mixing with the lead-tin in for example, C4 solder balls.

The invention further provides a liner material exhibiting good conformality when deposited in trenches and vias of BEOL structures.

The invention further provides a liner material which will not form a corrosion couple with Cu, Al, or W during or after chemical mechanical polishing of the liner material.

BRIEF DESCRIPTION OF THE DRAWING

These and other features, objects, and advantages of the present invention will become apparent upon consideration of the following detailed description of the invention when read in conjunction with the drawing in which:

FIG. 3 is a cross section view of a third embodiment of the invention.

FIG. 4 is a cross section view of a fourth embodiment of the invention.

DESCRIPTION OF THE PREFERRED EMBODIMENT

Figure 1:
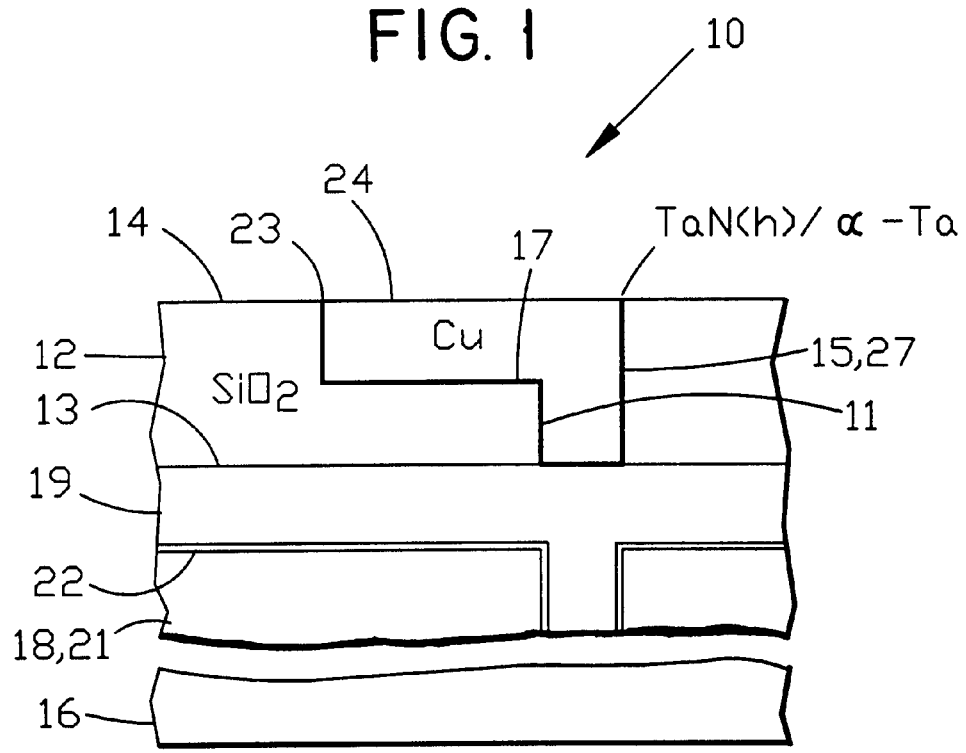
FIG. 1 is a cross section view of one embodiment of the invention.

Referring to the drawing and more particularly to FIG. 1, a cross section view of interconnect structures 10 and 18 is shown. Interconnect structure 10 includes a layer of insulation 12 having a lower surface 13 and an upper surface 14. A plurality of grooves or trenches 15 are formed in upper surface 14 of insulation layer 12. The plurality of grooves 15 may correspond to a wiring layer of a semiconductor chip 16. Additional interconnect structures may be provided to complete the interconnections for a semiconductor chip 16. Vias or stud openings 11 are formed at the bottom 17 of grooves 15 in selected regions to make contact to conducting surfaces in a second interconnect structure 18 below the insulation layer 12.

Interconnect structure 18 has a conductor 19 in a groove 20 in insulation layer 21. A liner 22 is shown between conductor 19 and the bottom and sidewalls of groove 20.

A liner 23 of TaN (hexagonal) is formed in grooves 15 on the sidewalls 27 and bottom 17 followed by formation of metal 24 in grooves 15 to substantially fill grooves 15. Metal 24 may be Cu, Al, W and alloys thereof. Metal 24 may be formed by sputtering, physical vapor deposition (PVD), chemical vapor deposition (CVD) or electroplating. Liner 23 may be formed by sputtering in an atmosphere of nitrogen. Liner 23 may include a second layer of Ta (alpha phase) formed adjacent to such as over TaN (hexagonal). Insulation layer 12 as well as insulation layer 21 may be for example $SiO_2$, $Si_3N_4$, polymer such as polyimide, diamond-like carbon (DLC) and Fluorinated diamond-like carbon (F-DLC).

Where liner 23 is a highly oriented layer of TaN in the hexagonal phase, the resistivity will be in the range from 150 to 300 micro ohm-cm. Where liner 23 is a non-highly oriented layer of TaN in the hexagonal phase, the resistivity will be greater than 300 micro ohm-cm. Where a layer of Ta in the alpha phase is formed adjacent the TaN (hexagonal), the resistivity of the Ta (alpha phase) will be in the range from 15 to 60 micro ohm-cm.

Figure 2:
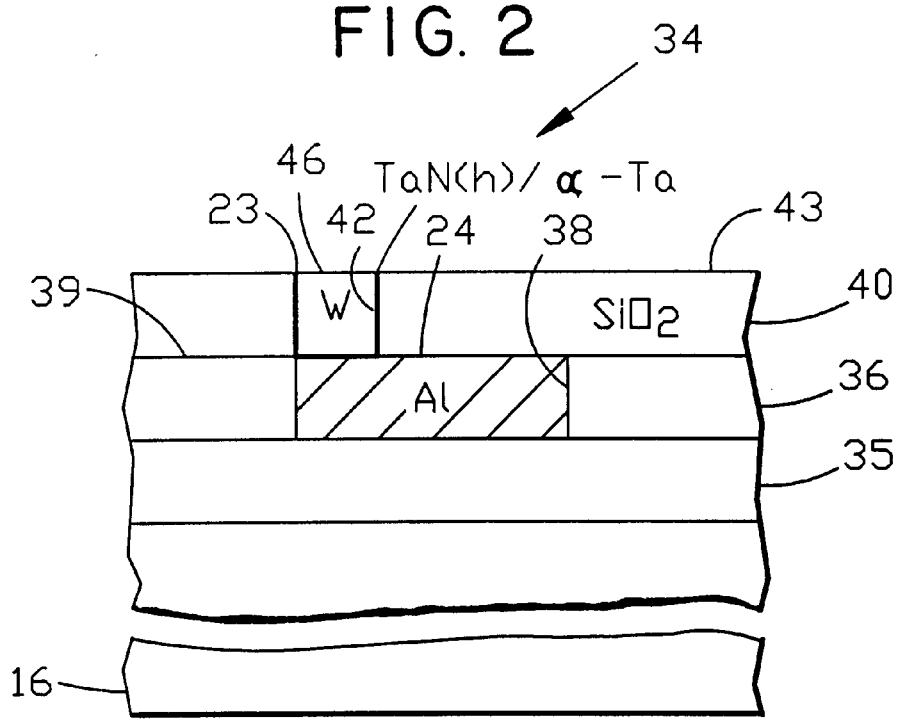
FIG. 2 is a cross section view of a second embodiment of the invention.

FIG. 2 is a cross section view of interconnect structure 34. FIG. 2 shows a semiconductor substrate 16 which may be for example Si, SiGe, Ge, or GaAs. Above substrate 16 may be a layer of insulation 35 which may be for example silicon dioxide. A layer of insulation 36 may be formed over layer of insulation 35 having a groove or trench 38 formed therein filled with metal 24. Layer of insulation 36 and metal 24 may have a coplanar upper surface 39 formed by chemical-mechanical polishing (CMP). A layer of insulation 40 is formed on upper surface 39. A groove or trench 42 is formed in layer of insulation 40 down to metal 24. A liner 23 is formed on the sidewalls and bottom of groove 42 and on the upper surface 43 of layer of insulation 40 (not shown). Groove or trench 42 is filled with metal 46 over liner 23 and on the liner on upper surface 43 (not shown). The excess metal 46 and liner 23 are removed by CMP to provide a planarized upper surface 43 as shown in FIG. 2. In FIG. 2, metal 24 may be for example Al and metal 46 may be tungsten.

FIG. 3 is a cross section view of interconnect structure 50. In FIG. 3, semiconductor substrate 16 has an insulation layer 52 thereover which may be formed by thermal oxidation. A layer 54 of insulation is formed on upper surface 53 on insulation layer 52. A groove or trench 56 is formed in insulation layer 54 and filled with metal 24 and may be for example Al. Insulation layer 54 and metal 24 may have a coplanar upper surface 58 formed by CMP. A layer 12 of insulation is formed on upper surface 58. Layer 12 has an upper surface 14. A groove 15 and via 11 is formed in upper surface 14. A liner 23 is formed on sidewalls 27 and bottom 17 of groove 15 and via or stud 11. Metal 24 is formed over liner 23 in groove 15 and via or stud 11. Upper surface 14 is planar which may be formed by CMP. A layer of insulation 62 is formed on upper surface 14. An opening 64 is formed in layer 62 to expose metal 24'. Liner 23' is formed on the sidewalls 65 of opening 64 and on exposed metal 24'. A blanket metal layer 66 is formed on upper surface 67 on insulation layer 62 and metal 24'. Blanket metal layer 66 is etched through a mask not shown to form a metal pattern for wiring or interconnects. In FIG. 3, metal layer 66 may be for example Al. Metal 24' may be for example Cu and metal 24 may be for example Al.

Thus as shown in FIG. 3, liner 23 separates metal 24 and 24' and liner 23' separates metal 24' and metal 66.

FIG. 4 is a cross section view of interconnect structure 70. In FIG. 4, substrate 16 has a layer of insulation 72 thereover which may be for example silicon dioxide. Interconnect structure 12 is formed over layer of insulation 72. Insulation layer 62 is formed on upper surface 14. An opening 64 is formed in layer 62 to expose metal 24'. Liner 23' is formed on the sidewalls 65 of opening 64 and on exposed metal 24'. A C4 contact bump 74 of mostly Pb—Sn is formed on liner 23' in opening 64. The C4 bump is manufactured by the IBM Corp on integrated circuit chips for making interconnections. The C4 bump extends above the integrated circuit chip by about 0.125 millimeters and is round or circular in cross-section parallel to the plane of the upper surface of the integrated circuit chip and is curved from its sides to the top surface of the bump where an interconnection is made to another electrode supported by a substrate.

In FIGS. 2–4, like references are used for functions corresponding to the apparatus of FIG. 1 or of an earlier FIG. than the FIG. being described.

Figure 5:
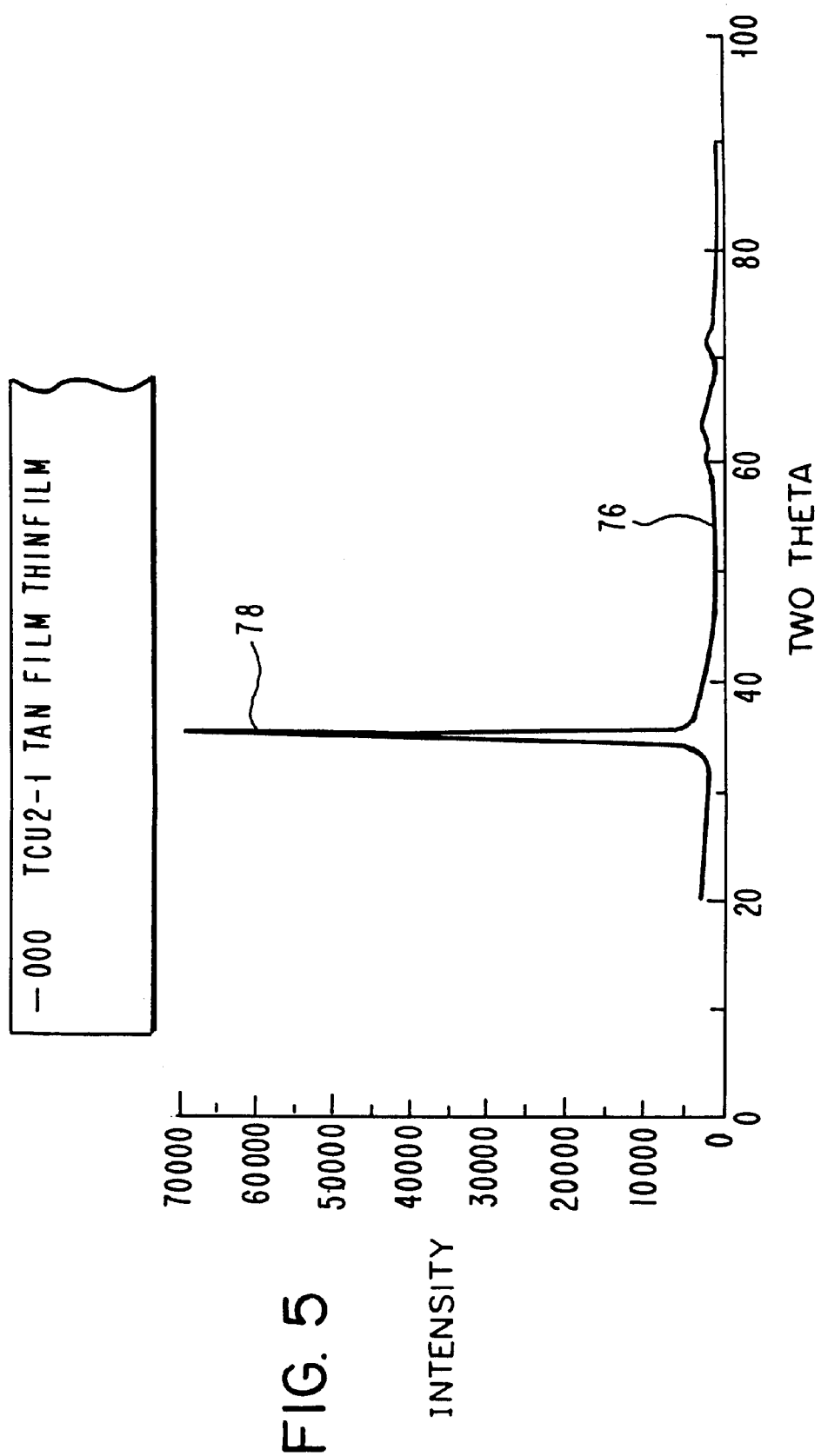
FIG. 5 is a graph of an X-ray diffraction pattern for a TaN (hexagonal) film.

FIG. 5 is a graph of an X-ray diffraction pattern for a TaN (hexagonal phase) film formed by physical vapor deposition (PVD). The following PVD arrangement was used to provide highly-oriented and non-oriented TaN (hexagonal) films. The TaN (hexagonal) films were reactively sputter deposited using a magnetron system in either the direct current or radio frequency mode i.e. dc or rf mode. The highly oriented and non-oriented TaN (hexagonal) films made under the above conditions had resistivities in the range from 150 to 800 micro ohm-cm. In FIG. 5, the ordinate represents intensity and the abscissa represents two theta. Curve 76 shows the X-ray diffraction pattern for two films; the first film has a high degree of preferred orientation and the second film is a non-oriented film. Curve portion 78 shows a single peak at about 37 degrees.

Figure 6:
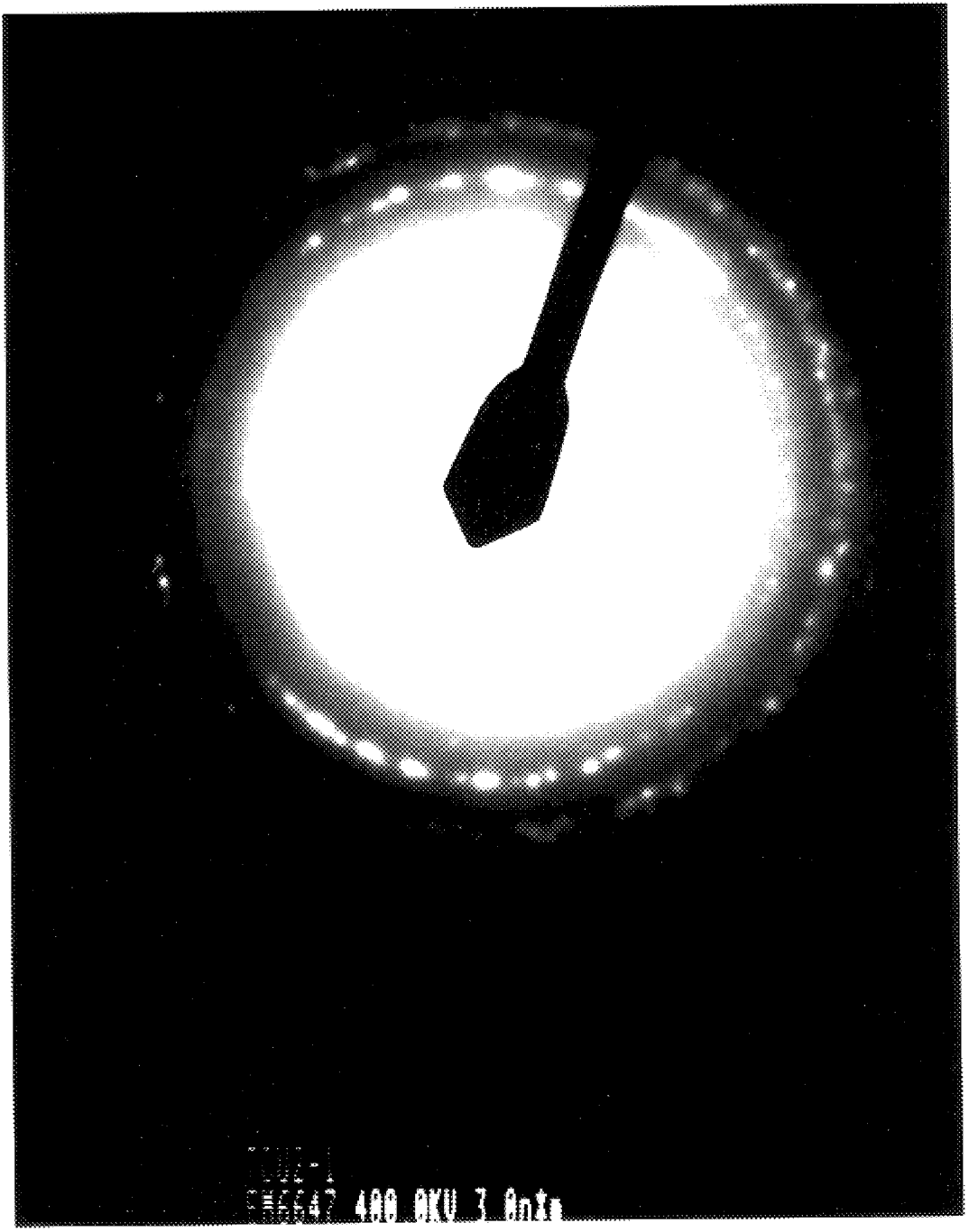
FIG. 6 is a Transmission Electron Microscope (TEM) micrograph of a diffraction pattern from TaN (hexagonal) film.

FIG. 6 is a Transmission Electron Microscope (TEM) diffraction pattern of a TaN (hexagonal phase) highly oriented film previously measured with X-rays in FIG. 5. The micrograph confirms the hexagonal structure of the TaN barrier showing rings indexed to the hexagonal phase.

Figure 7A:
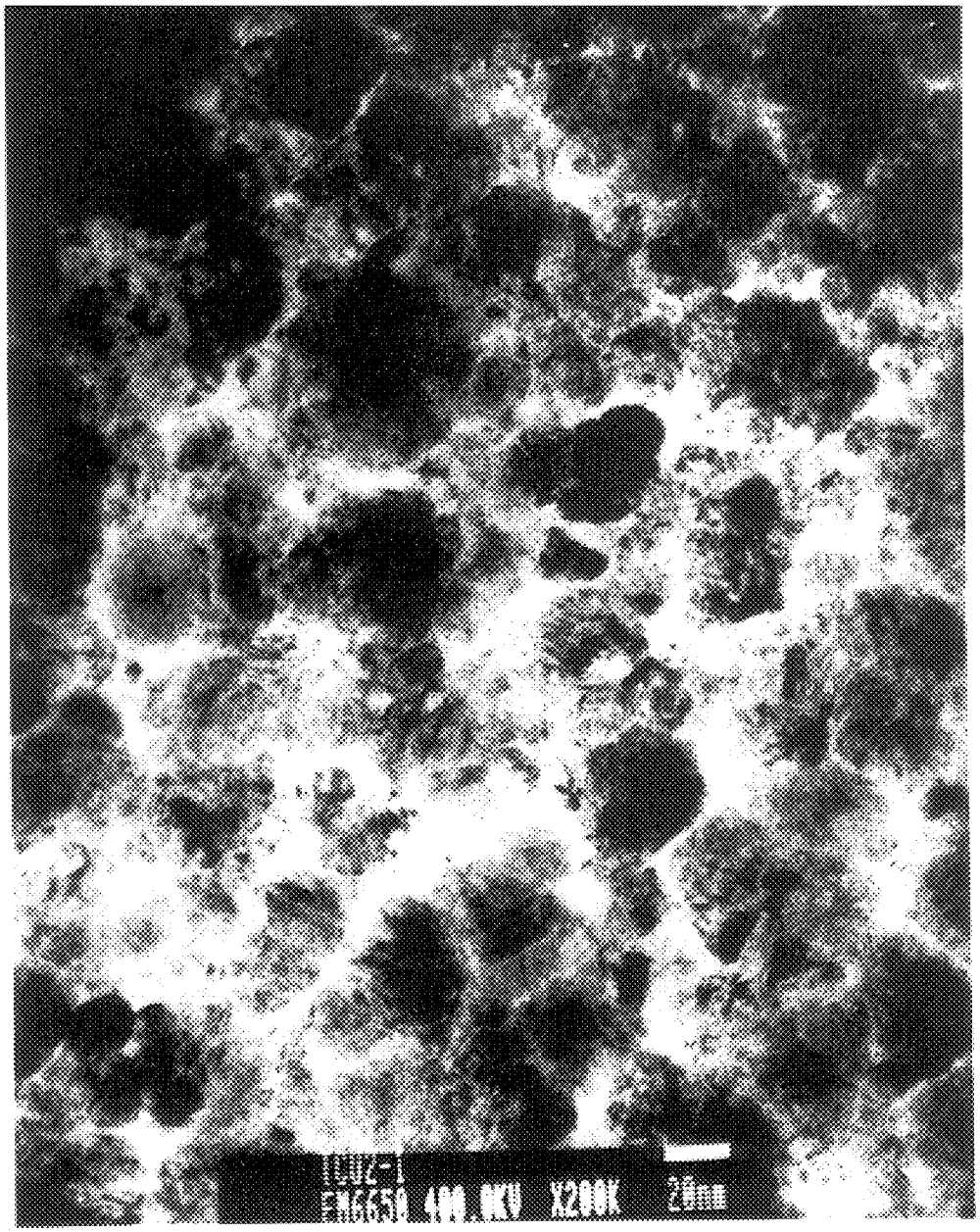
FIG. 7A is a Transmission Electron Microscope (TEM) micrograph of the same highly oriented TaN (hexagonal) film used to provide the X-ray diffraction pattern of FIG. 5.

FIG. 7A is a Transmission Electron Microscope (TEM) micrograph of a TaN (hexagonal phase) film previously measured with X-rays in FIG. 5. The micrograph shows hexagonal TaN grains which are highly oriented and approximately 20–30 nm in size.

Figure 7B:
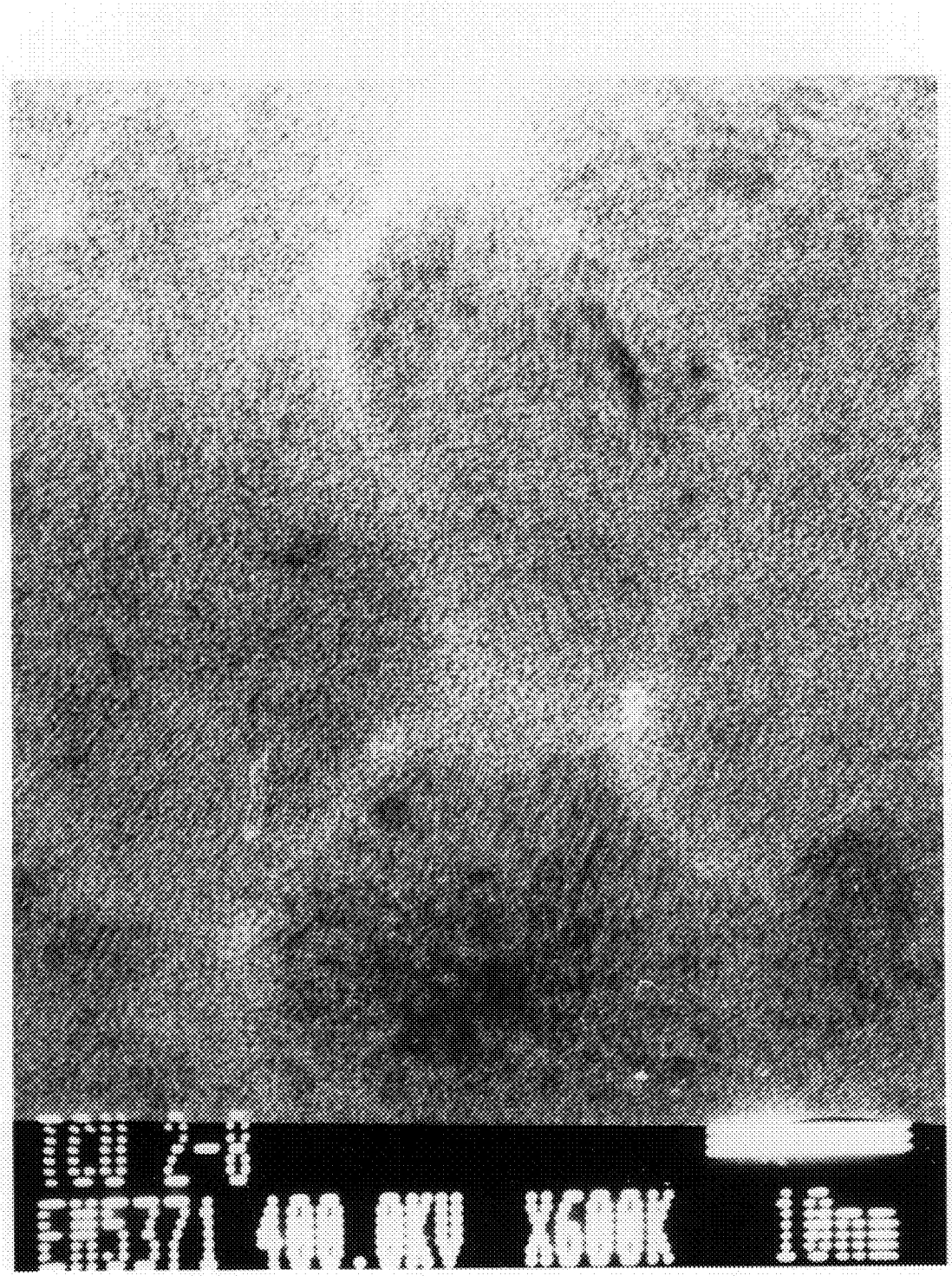
FIG. 7B is a Transmission Electron Microscope (TEM) micrograph of non-highly oriented (random) TaN (hexagonal) film.

FIG. 7B is a Transmission Electron Microscope (TEM) micrograph of a TaN (hexagonal phase) film. The micrograph show hexagonal TaN grains which are randomly oriented and also approximately 20–30 nm in size.

Figure 8:
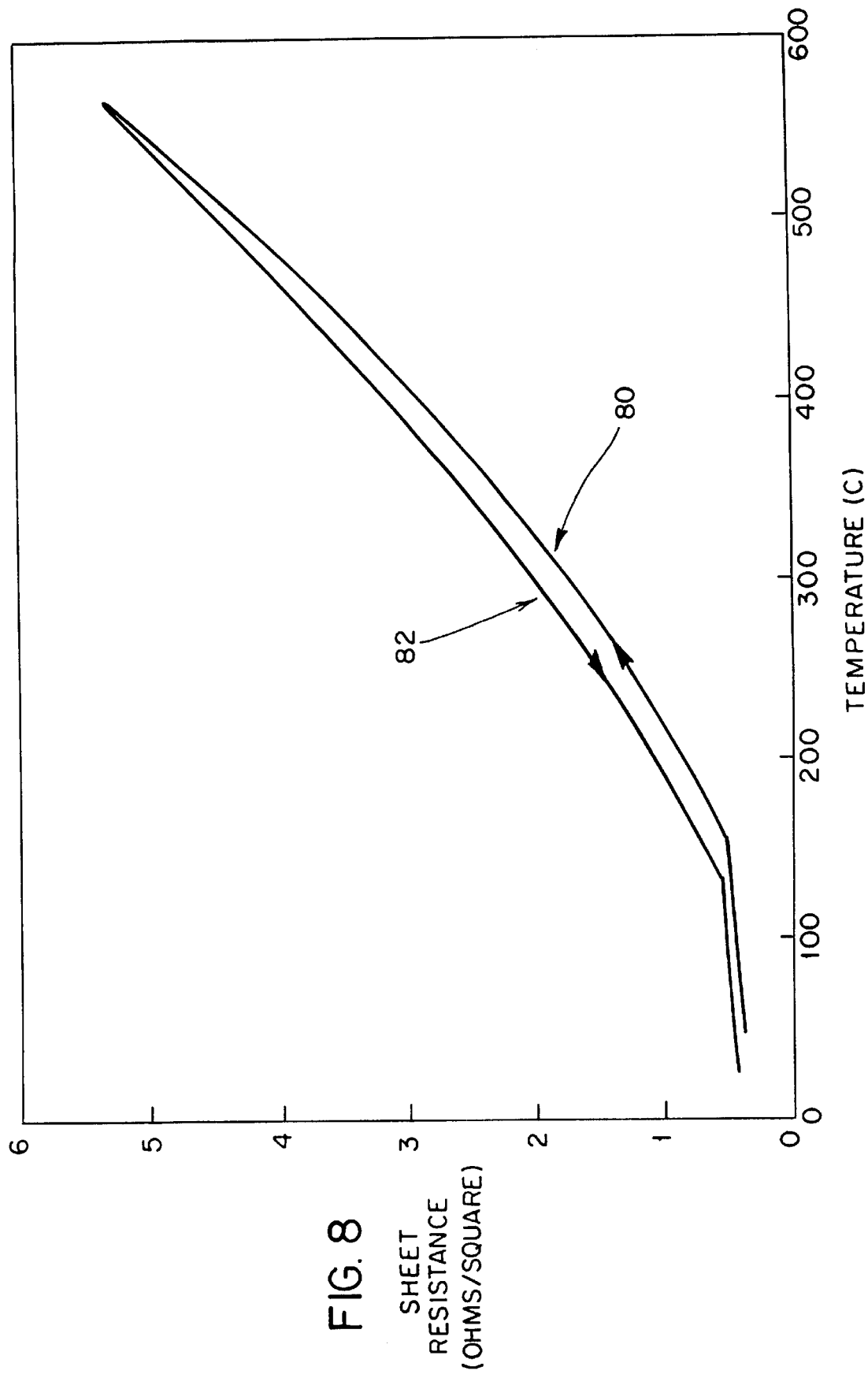
FIG. 8 is a graph of the resistance versus temperature profile of a $SiO_2$/Cu/TaN (hexagonal)/Al layered structure.

FIG. 8 is a graph of the resistance versus temperature provided of a $SiO_2$/Cu/TaN (hexagonal)/Al multilayer structure. In FIG. 8, the ordinate represents resistance in ohms/square and the abscissa represents Temperature in degrees Centigrade. Curve 80 shows the resistance with increasing temperature and curve 82 shows the resistance with decreasing temperature. Curves 80 and 82 provide evidence of the effectiveness of TaN (hexagonal) in isolating Cu from Al up to temperatures greater than 500 degrees Centigrade.

Figure 9:
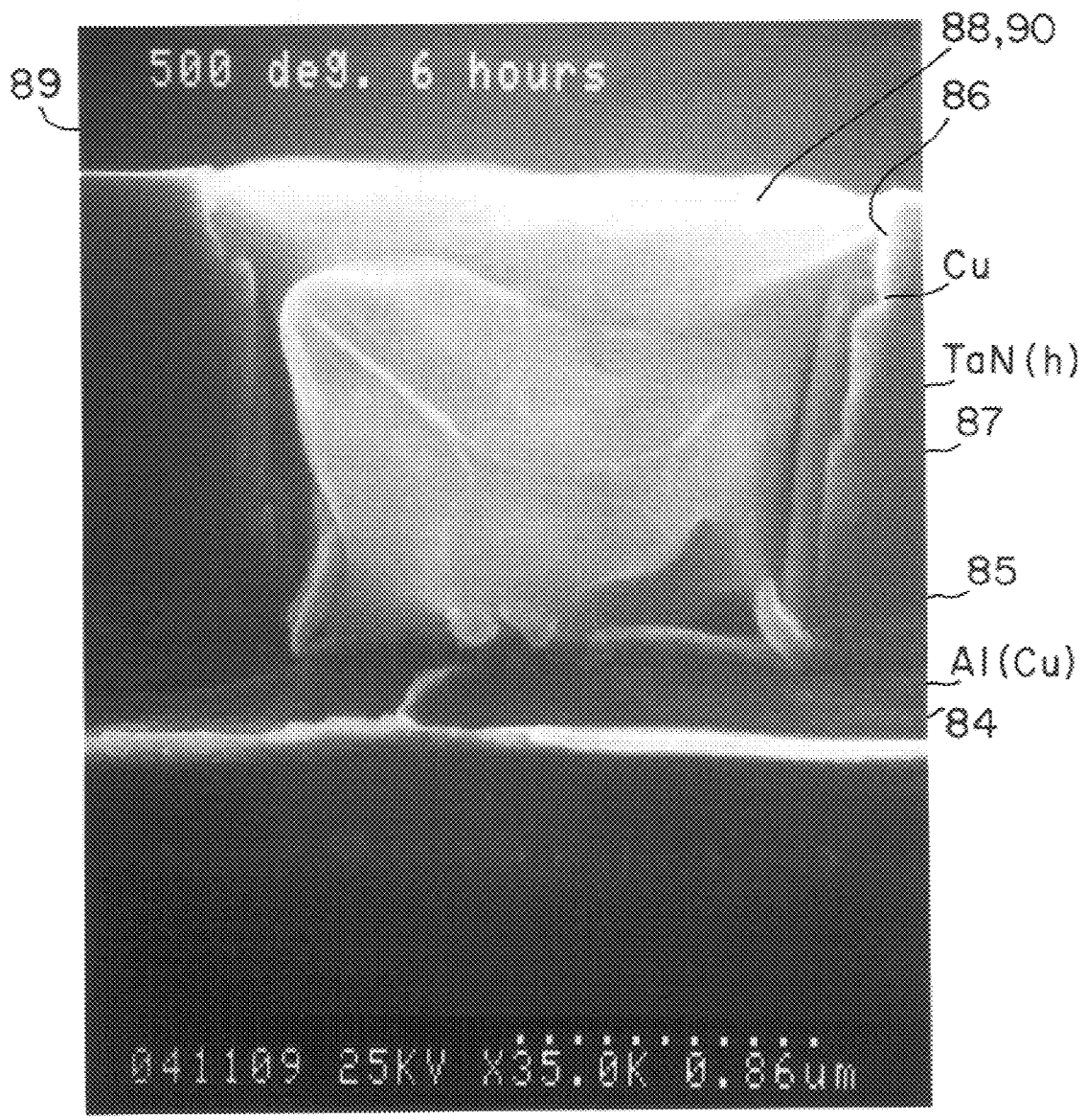
FIG. 9 is a cross-section view of a liner of TaN (hexagonal) for isolating Cu from Al.

FIG. 9 is a cross-section view of a liner of TaN (hexagonal) to isolate Cu from Al. In FIG. 9, an interconnect structure is shown with a layer of Al(Cu) 84, insulation layer 85 of $SiO_2$, and opening or via 86 with a liner 87 on the bottom and sidewalls. Opening 86 is filled with Cu 88 inside liner 87. The excess liner 87 and Cu 88 is removed to form upper surface 89 on insulation layer 85 and upper surface 90 of Cu 88 by CMP. After a temperature anneal at 500 degrees Centigrade for 6 hours, the integrity and the definition of liner 87 remains showing no penetration of Cu through liner 87 to the Al(Cu) layer.

Figure 10:
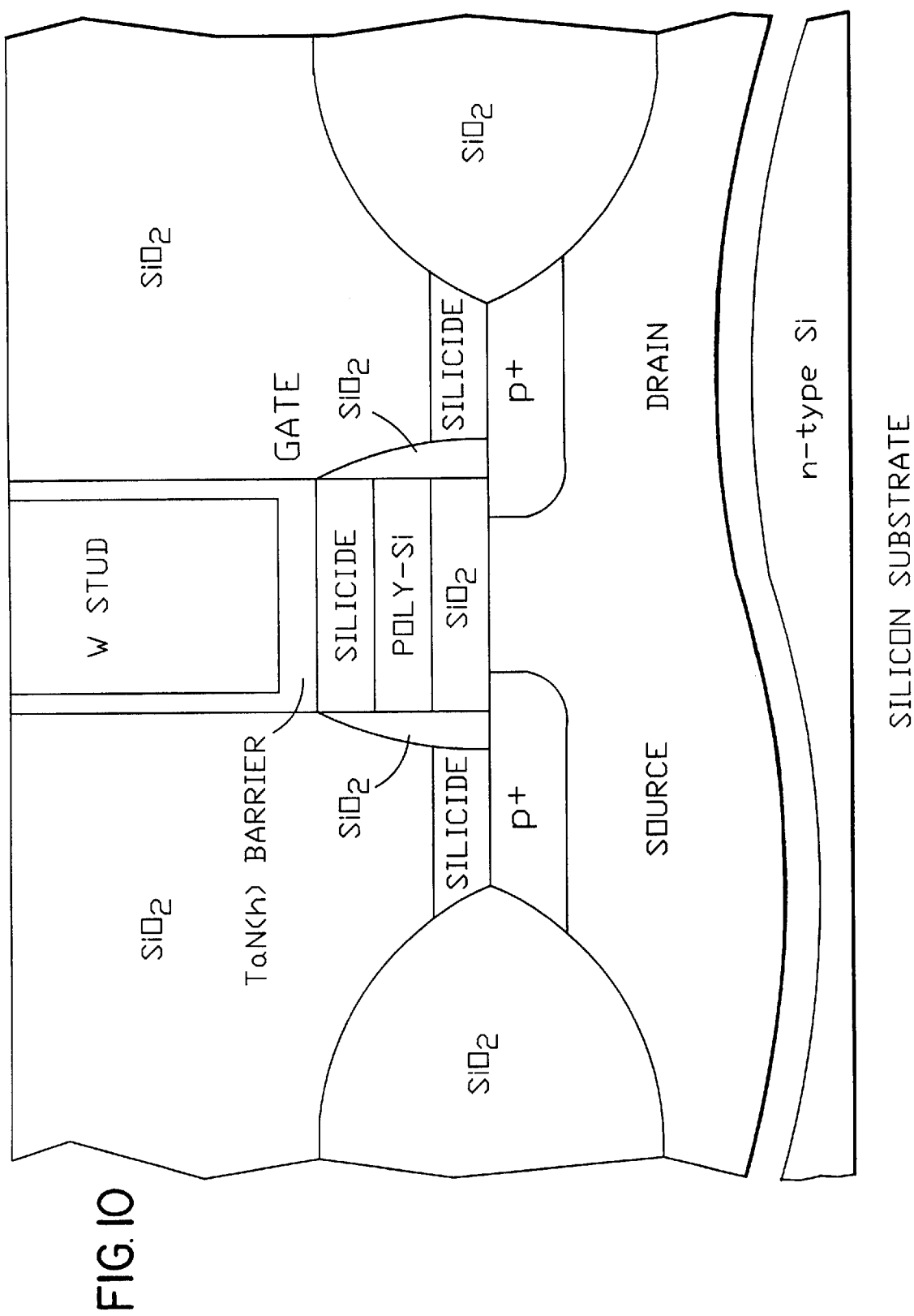
FIG. 10 is a cross section view of a fifth embodiment of the invention.

FIG. 10 is a cross-section view which depicts the disclosed TaN(hexagonal) barrier used between the silicide gate contact and the W stud in a P-MOSFET (P-type metal oxide semiconductor field effect transistor).

Ta(N) has the advantage as published in U.S. Pat. No. 5,281,485 by Colgan et al. which issued Jan. 15, 1994 that it acts to seed only the low-resistivity alpha phase Ta (rho=15 to 60 micro ohm-cm), in contrast to the higher-resistivity beta phase Ta. By using TaN (hexagonal), the resulting via resistances for deep-submicron copper vias with a composite TaN (hexagonal)/ alpha phase Ta liner would be in the resistivity range from 0.25 to 1 Ohms. This resistivity is a substantial improvement, about 5 times better, over the previous copper via systems using Ta alone or another material. The resistivity is probably an order of magnitude better than the Al(Cu)/W via system presently used by some major semiconductor manufacturers.

While there has been described and illustrated a barrier layer and an interconnect structure containing a layer of TaN (hexagonal phase) alone or with a second layer of Ta (alpha phase), it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A barrier layer comprising:
   a layer of TaN in the hexagonal phase positioned between a first material to be confined and a second material whereby said second material is isolated from said first material.

2. The barrier layer of claim 1 wherein said first material is selected from the group consisting of Cu, alloys of Cu, Al, alloys of Al, W, and PbSn.

3. The barrier layer of claim 1 wherein said second material is selected from the group consisting of $SiO_2$, spin-on-glass, $Si_3N_4$, polyimide, diamond-like carbon (DLC), and fluorinated diamond-like carbon (F-DLC), $WSi_2$, $CoSi_2$, $TiSi_2$, PtSi.

4. The barrier of claim 1 wherein said layer of TaN in the hexagonal phase is highly oriented having a resistivity in the range from 150 to 300 micro ohm-cm.

5. The barrier of claim 1 wherein said layer of TaN in the hexagonal phase is non-highly oriented having a resistivity greater than 300 micro ohm-cm.

6. The barrier layer of claim 1 further including a Ta layer formed adjacent to said layer of TaN.

7. The barrier layer of claim 6 wherein said Ta layer is in the alpha phase.

8. The barrier layer of claim 7 wherein said Ta layer is formed on said layer of TaN.

9. The barrier layer of claim 8 wherein said Ta layer has a resistivity in the range from 15 to 60 micro ohm-cm.

10. A metal diffusion barrier in a semiconductor chip comprising:
    a layer consisting of TaN in the hexagonal (h) phase and a body centered cubic (bcc) phase between a first material and a second material whereby said first and second materials are isolated from each other, said hexagonal phase being in the range from 50 to 100%.

11. The metal diffusion barrier of claim 10 wherein said first material is selected from the group consisting of Cu, alloys of Cu, Al, alloys of Al, W, and PbSn.

12. The metal diffusion barrier of claim 11 wherein said second material is selected from the group consisting of Cu, alloys of Cu, Al, alloys of Al, W, and PbSn.

13. The metal diffusion barrier of claim 11 wherein said second material is selected from the group consisting of $SiO_2$, spin-on-glass, $Si_3N_4$, polyimide, diamond-like carbon (DLC), and fluorinated diamond-like carbon (F-DLC), $WSi_2$, $CoSi_2$, $TiSi_2$, and PtSi.

14. The metal diffusion barrier of claim 11 further including a layer of Ta consisting of Ta in the alpha phase adjacent said layer of TaN and between said layer of TaN and said first material to provide a redundant conductive path to said first material and adhesion to said first material.

15. The metal diffusion barrier of claim 11 wherein said second material is an insulation layer having an upper and lower surface and having a plurality of grooves having respective sidewalls and a bottom formed in said upper surface, said layer of TaN formed on said sidewalls and bottom of said plurality of grooves; said first material formed in said plurality of grooves to substantially fill said plurality of grooves.

16. The metal diffusion barrier layer of claim 15 further including a layer Ta consisting of Ta in the alpha phase adjacent said layer TaN and between said layer of TaN and said first material to provide a redundant conductive path to said first material and adhension to said first material.

17. The metal diffusion barrier layer of claim 15 wherein some of said plurality of grooves have regions extending to said lower surface to expose respective conducting surfaces, said layer of TaN formed on said exposed respective conducting surfaces.

18. The metal diffusion barrier of claim 11 wherein said layer of TaN consists of 100% hexagonal phase.

19. The metal diffusion barrier of claim 10 wherein said second material is selected from the group consisting of $SiO_2$, spin-on-glass, $Si_3N_4$, polyimide, diamond-like carbon (DLC), and fluorinated diamond-like carbon (F-DLC), $WSi_2$, $CoSi_2$, $TiSi_2$, and PtSi.

20. The metal diffusion barrier of claim 10 wherein said layer of TaN consists of 100% hexagonal phase.

21. The metal diffusion barrier of claim 20 further including a layer of Ta consisting of Ta in the alpha phase adjacent said layer of TaN and between said layer of TaN and said first material to provide a redundant conductive path to said first material and adhesion to said first material.

22. The metal diffusion barrier of claim 10 wherein said layer of TaN includes a mixture of at least 50% hexagonal (h) phase and the remaining TaN in the body centered cubic (bcc) phase.

23. The metal diffusion barrier of claim 22 further including a layer of Ta consisting of Ta in the alpha phase adjacent said layer of TaN and between said layer of TaN in the hexagonal phase and said first material to provide a redundant conductive path to said first material and adhesion to said first material.

24. The metal diffusion barrier of claim 22 wherein said layer of TaN has N in the range from 30 to 60 at.%.

* * * * *